(12) United States Patent
Masukawa

(10) Patent No.: US 6,421,819 B1
(45) Date of Patent: Jul. 16, 2002

(54) INTEGRATED CIRCUIT LAYOUT DESIGNING SYSTEM AND POWER SOURCE ELIMINATING METHOD TO BE EMPLOYED IN THE SAME USING ARRANGING POWER BLOCKS

(75) Inventor: Fuminori Masukawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/413,493

(22) Filed: Oct. 6, 1999

(30) Foreign Application Priority Data

Oct. 7, 1998 (JP) .......................................... 10-284666

(51) Int. Cl.[7] .............................................. G06F 17/50
(52) U.S. Cl. ....................................................... 716/19
(58) Field of Search .............................. 716/1, 6, 11–17

(56) References Cited

U.S. PATENT DOCUMENTS 5,347,465 A    9/1994  Ferreri et al. ................. 716/19
6,230,403 B1 * 5/2001  Skoolicas ..................... 716/15

FOREIGN PATENT DOCUMENTS

| JP | 6-29502   | 2/1994 |
| JP | 6-244387  | 9/1994 |
| JP | 9-36238   | 2/1997 |
| JP | 10-209285 | 8/1998 |
| JP | 11-145293 | 5/1999 |

* cited by examiner

Primary Examiner—Matthew Smith
Assistant Examiner—Thuan Do
(74) Attorney, Agent, or Firm—Foley & Lardner

(57) ABSTRACT

An integrated circuit layout design system and a power source eliminating method to be employed in the same can realize high wiring receiving capability, can achieve speeding up by shortening delay period of signal wiring, significantly eliminate design load, and can prevent lowering of function. The integrated circuit layout designing system performs a layout design of an integrated circuit having a basic power source wiring structure consisted of a power source wiring and a grounding wiring. The integrated circuit layout designing system also eliminates the power source wiring and a power source via other than the basic power source wiring structure for supplying a power to a function block after arranging the function block on the basic power source wiring structure.

27 Claims, 11 Drawing Sheets

FIG.3A
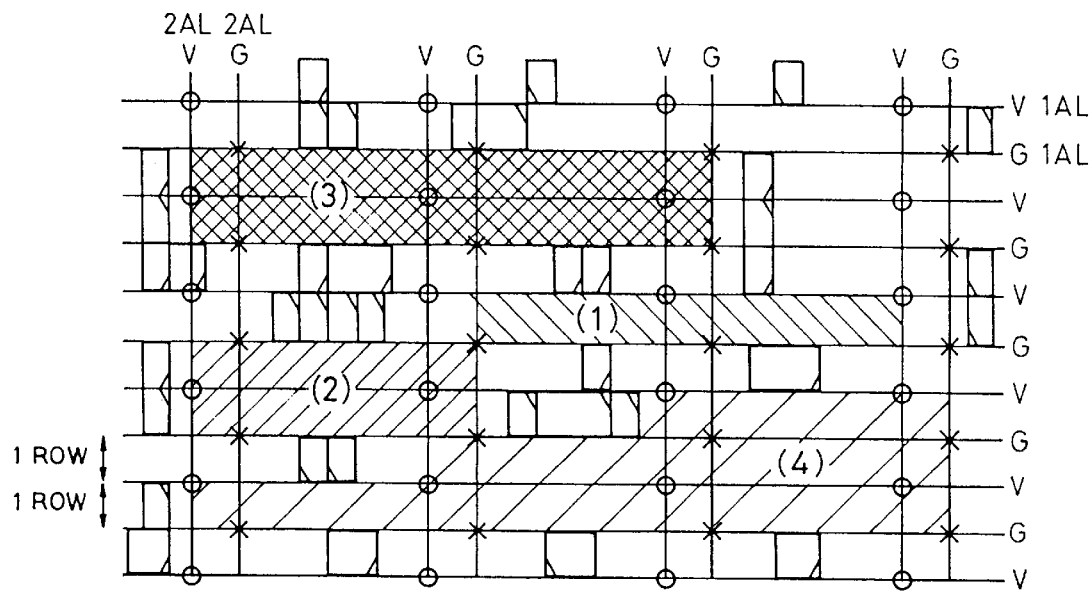
 : FUNCTION BLOCK
FIG.3B
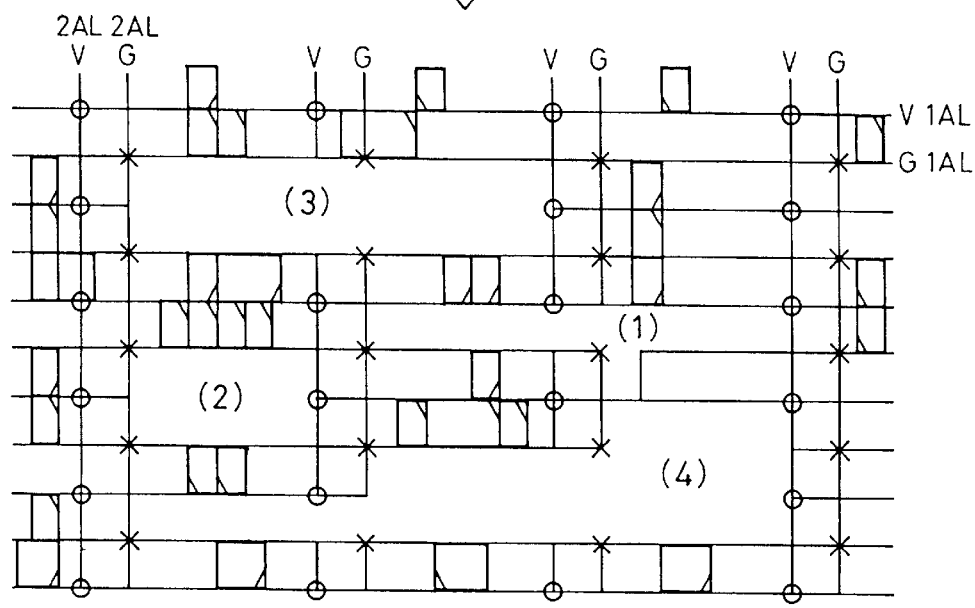

INTEGRATED CIRCUIT LAYOUT DESIGNING SYSTEM AND POWER SOURCE ELIMINATING METHOD TO BE EMPLOYED IN THE SAME USING ARRANGING POWER BLOCKS

BACKGROUND OF THE INVENTION

1. Field of the Invention

The present invention relates generally to an integrated circuit layout designing system and a power source eliminating method to be employed in the same. More particularly, the invention relates to a layout designing method of a Large Scale Integrated Circuit (LSI) having a basic power source wiring structure consisted of a power source wiring and a grounding wiring.

2. Description of the Related Art

Conventionally, an LSI layout designing system to be employed in a layout designing method of the type set forth above shown in FIG. 10 is constructed with a function block (FB) library 1, a function block library reading portion 2, a power source and clock (CLK) wiring portion 3, a function block arranging portion 4, a wiring portion 6, a wiring verifying portion 7, a floor plan modifying portion 8, a layout information outputting portion 9, a function eliminating or chip size modifying portion 10 and a control memory 14.

In the LSI layout designing system 13 constructed as set forth above, process operation shown in FIG. 11 is performed by executing programs stored in the control memory 14 at respective portion upon performing layout design of the LSI.

Namely, when the function block library reading portion 2 reads out information necessary for layout design from the function block library 1 (step S21 of FIG. 11), the power source and clock wiring portion 3 performs power source wiring operation and clock wiring operation on the basis of the read out information. (step S22 of FIG. 11).

After the power source wiring operation and the clock wiring operation, the function block arranging portion 4 arranges the function blocks (step S23 of FIG. 11) and the wiring portion 6 performs wiring operation for the arranged function blocks (step S24 of FIG. 11).

After completion of wiring operation by the wiring portion 6, the wiring verifying portion 7 checks whether not yet formed wiring is present or not (step S25 of FIG. 11). The wiring verifying portion 7 makes judgment whether not yet formed wiring is present and integration is possible. If the result of judgment is positive, the floor plan modifying portion 8 modifies a floor plan and returns control to the function block library reading portion 2 (step S27 of FIG. 11).

If the result of checking in the wiring verifying portion 7 shows that the not yet formed wiring is not present, the lay out information outputting portion 9 outputs the layout information generated through the foregoing process (step S26 of FIG. 11). On the other hand, if the result of judgment in the floor plan modifying portion 8 shows that not yet formed wiring is present but no further integration is possible, the function eliminating or chip size modifying portion 10 eliminates the function or modifies a chip size and then returns control to the function block library reading portion 2 (step S28 of FIG. 11).

In the conventional LSI layout designing method set forth above, if a space is not enough for providing signal wiring, a region where not yet formed wiring is present, is processed for forming the requiring wiring by-passing the existing wiring by automatic correction or manual area correction. Therefore, delay period can become longer for extra length of wiring bypassing the existing signal wiring. This can be a cause of restriction of speeding up of LSI.

On the other hand, if channel wiring region for the signal is too small to form all of required wiring, it becomes inherent to modify layout or floor plan, to modify logic, to eliminate logical function or so forth. This causes significant increase of process steps for repeated design due to floor plan modification or so forth.

SUMMARY OF THE INVENTION

The present invention has been worked out in view of the problem set forth above. Therefore, it is an object of the present invention to provide an integrated circuit layout design system and a power source eliminating method to be employed in the same, which can realize high wiring receiving capability, can achieve speeding up by shortening delay period of signal wiring, significantly eliminate design load, and can prevent lowering of function.

According to the first aspect of the present invention, an integrated circuit layout designing system for performing a layout design of an integrated circuit having a basic power source wiring structure consisted of a power source wiring and a grounding wiring, comprises:

eliminating means for eliminating the power source wiring and a power source via other than the basic power source wiring structure for supplying a power to a function block after arranging the function block on the basic power source wiring structure.

According to the second aspect of the present invention, a power source eliminating method in a layout design of an integrated circuit having a basic power source wiring structure consisted of a power source wiring and a grounding wiring, comprises a step of:

eliminating the power source wiring and a power source via other than the basic power source wiring structure for supplying a power to a function block after arranging the function block on the basic power source wiring structure.

According to the third aspect of the present invention, a storage medium recording a power source elimination control program to be executed by a computer for eliminating a power source wiring in a layout design of an integrated circuit having a basic power source wiring structure consisted of a power source wiring and a grounding wiring, the power source elimination control program comprises a step of:

eliminating the power source wiring and a power source via other than the basic power source wiring structure for supplying a power to a function block after arranging the function block on the basic power source wiring structure.

Namely, the power source eliminating method in the integrated circuit layout according to the present invention maintains the basic power source wiring for supplying sufficient power to the function block after arranging the function and eliminates remaining power source wiring and the power source via, by making the layout designing tool to recognize the power source wiring structure.

By this, since the channel wiring region for the signal can be certainly obtained in the region where the power source is eliminated, higher package density of the LSI can be achieved and by-pass wiring can be reduced to contribute for speeding up of the LSI.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings:

FIG. 3A is an illustration showing a power source eliminating region after arranging the function block in one embodiment of the present invention;

FIG. 3B is an illustration showing the power source eliminating region after eliminating the power source in one embodiment of the present invention;

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention.

Figure 1:
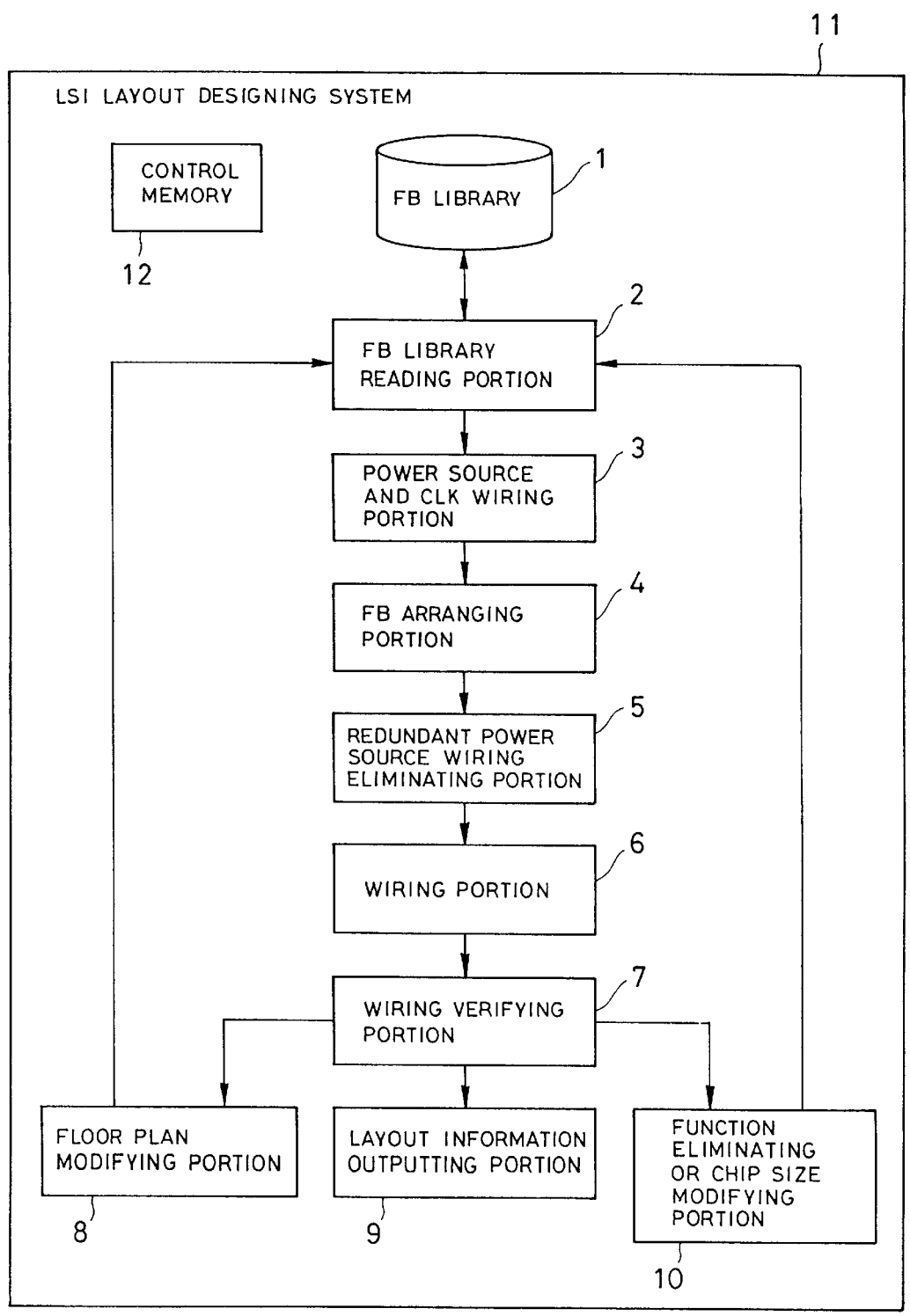
FIG. 1 is a block diagram showing a construction of one embodiment of an LSI layout designing system according to the present invention.

FIG. 1 is a block diagram showing a construction of one embodiment of an LSI layout designing system according to the present invention. In FIG. 1, an LSI layout designing system 11 is constructed with a function block (FB) library 1, a function block library reading portion 2, a power source and clock (CLK) wiring portion 3, a function block arranging portion 4, a redundant power source wiring eliminating portion 5, a wiring portion 6, a wiring verifying portion, a floor plan modifying portion 8, a layout information outputting portion 9, a function eliminating or chip size modifying portion 10 and a control memory 12.

In the function block library 1, information necessary for layout design is preliminarily stored. The function block library reading portion 2 reads out a necessary layout data from the function block library 1 to transfer to the power source and clock wiring portion 3.

The power source and clock wiring portion 3 performs power source wiring operation and clock wiring operation on the basis of the layout data read out by the function block library reading portion 2, and transfers the layout data added information of power source wiring and the clock wiring to the function block arranging portion 4. The function block arranging portion 4 arranges the function block after performing the power source wiring operation and the clock wiring operation and transfers the layout data further added arrangement information of the function block to the redundant power source wiring eliminating portion 5.

The redundant power source wiring eliminating portion 5 eliminates the redundant power source wiring after arranging the function block by the function block arranging portion 4, and transfers the layout data added the elimination information of the redundant power source wiring to the wiring portion 6. The wiring portion 6 performs wiring operation to the function block after elimination of the redundant power source wiring and transfers the layout data further added information of the wiring to the function block to the wiring verifying portion 7.

The wiring verifying portion 7 is responsive to finishing of wiring operation by the wiring portion to check whether not yet formed wiring is present or not and transfers the layout data generated through the foregoing processes to one of the floor plan modifying portion 8, the layout information outputting portion 9 and the function eliminating or chip size modifying portion 10 depending upon the result of checking. Namely, if the wiring verifying portion 7 makes judgment that the not yet formed wiring is present and further integration is possible, the layout data is transferred to the floor plan modifying portion 8. On the other hand, if judgment is made that the not yet formed wiring is not present, the wiring verifying portion 7 transfers the layout data to the layout information outputting portion 9. If the not yet formed wiring is present and no further integration is possible, the wiring verifying portion 7 transfers the layout data to the function eliminating or chip size modifying portion 10.

The floor plan modifying portion 8 modifies a floor plan for the transferred layout data and returns the layout data after modification to the function block library reading portion 2. The layout information outputting portion 9 outputs the transferred layout data. On the other hand, the function eliminating or chip size modifying portion 10 eliminates function or modifies a chip size for the layout data transferred from the wiring verifying portion 7, and returns the layout data after modification to the function block library reading portion 2.

In the control memory 12, programs to be executed by respective portion of the LSI layout designing system 11 is stored. As the control memory, various storage medium, such as ROM (read-only-memory), floppy disk or so forth, can be used.

Figure 2A:
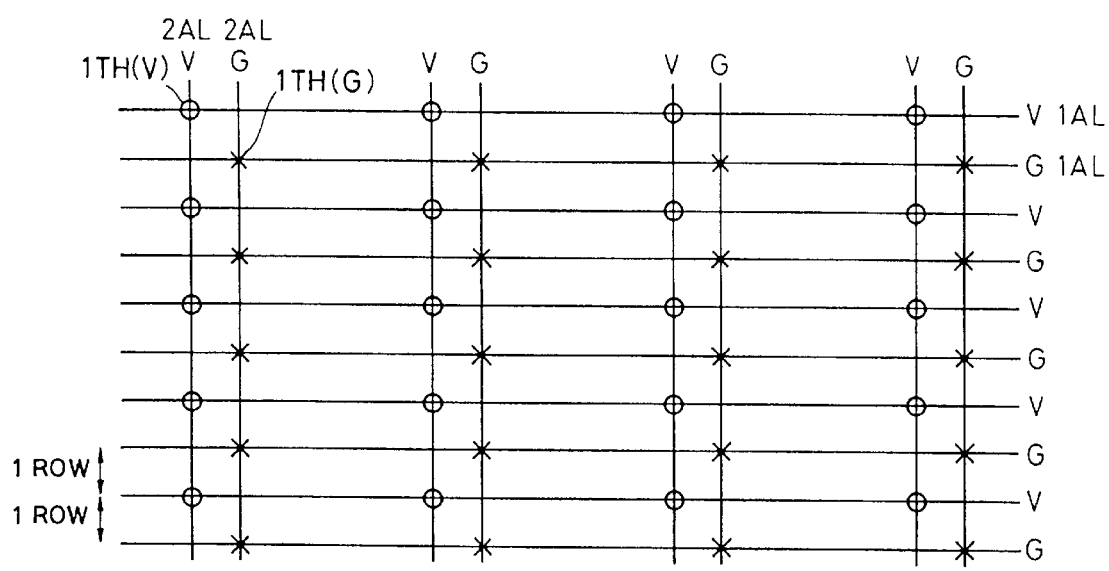
FIG. 2A is an illustration showing a construction of a power source wiring before arranging a function block to be used in one embodiment of the present invention.
Figure 2B:
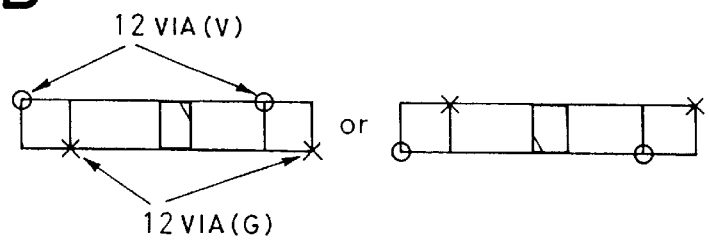
FIG. 2B is an illustration showing a construction of a basic power source wiring to be used in one embodiment of the present invention.

FIGS. 2A and 2B are illustrations showing a power source wiring structure to be used in one embodiment of the present invention, wherein FIG. 2A is an illustration showing the power source wiring structure before arranging the function block to be used in one embodiment of the present invention, and FIG. 2B is an illustration showing a basic power source wiring structure to be used in one embodiment of the present invention. The basic power source wiring structure shown in FIG. 2B represents a minimum unit for sufficient power supply [power source (V) and ground (G)] for the function block.

In FIGS. 2A and 2B, the power source wiring structure is consisted of a lateral power source wiring (V of 1AL) and a lateral grounding wiring (G of 1AL), and a longitudinal power source wiring (V of 2AL) and a longitudinal grounding wiring (G of 2AL). The lateral power source wiring and the longitudinal power source wiring are connected by a power source via [12 Via (V)] and the lateral grounding wiring and the longitudinal grounding wiring are connected by a grounding via [12 Via (G)].

FIGS. 3A and 3B are illustrations showing a power source eliminating region in one embodiment of the present invention, wherein FIG. 3A is an illustration showing the power source eliminating region after arrangement of the function block by one embodiment of the present invention, and FIG. 3B is an illustration showing the power source eliminating region after elimination of power source by one embodiment of the present invention.

In FIGS. 3A and 3B, (1) represents a region to be eliminated when the function block is not arranged in the region across a pair of the longitudinal power source wiring (V of 2AL) and the longitudinal grounding wiring (G of 2AL).

(2) represents a region to be eliminated when the function block is not arranged in a region upper and lower one row of the lateral power source wiring (V of 1AL) or the lateral grounding wiring (G of 1AL).

(3) represents a region to be eliminated when the function block is not arranged in a region across the longitudinal power source wiring (V of 2AL), the longitudinal grounding wiring (G of 2AL) and the lateral power source wiring (V of 1AL), the lateral grounding wiring (G of 1AL).

(4) represents a region to be eliminated when all of the conditions (1) to (3) for eliminating the region are satisfied. Namely, (4) is a region to be eliminated when the function block is not arranged in the region across a pair of the longitudinal power source wiring (V of 2AL) and the longitudinal grounding wiring (G of 2AL), the function block is not arranged in a region upper and lower one row of the lateral power source wiring (V of 1AL) or the lateral grounding wiring (G of 1AL) and the function block is not arranged in a region across the longitudinal power source wiring (V of 2AL), the longitudinal grounding wiring (G of 2AL) and the lateral power source wiring (V of 1AL), the lateral grounding wiring (G of 1AL).

Figure 4:
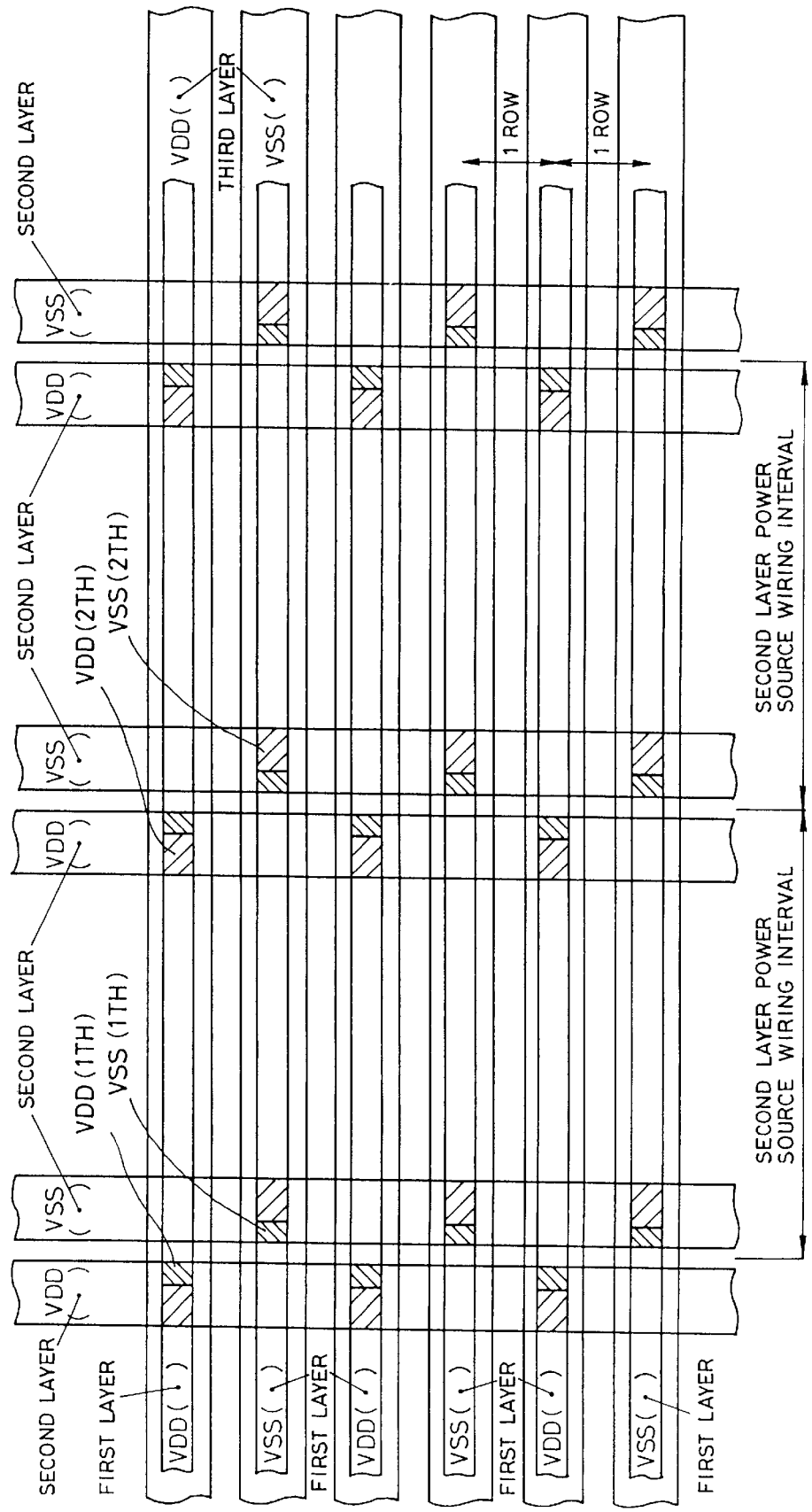
FIG. 4 is an illustration showing a basic pattern of a three-layer power source wiring structure within LSI according to a standard cell system to be employed in one embodiment of the present invention.

FIG. 4 is an illustration showing a basic pattern of a three layer power source wiring structure within the LSI according to a standard cell system, to be employed in one embodiment of the present invention. In FIG. 4, a wiring for power source (VDD) and grounding (VSS) in a first layer (lateral direction), a second layer in a (longitudinal direction) and a third layer (lateral direction) form a regular grid form power source wiring. The power source wiring and the grounding wiring in the first and second layers are electrically connected through power source via [VDD(1TH)] and grounding via [VSS(1TH)], respectively. Similarly, the power source wiring and the grounding wiring in the second and third layers are electrically connected through power source via [VDD(2TH)] and grounding via [VSS(2TH)], respectively.

Figures 5A, 5B:
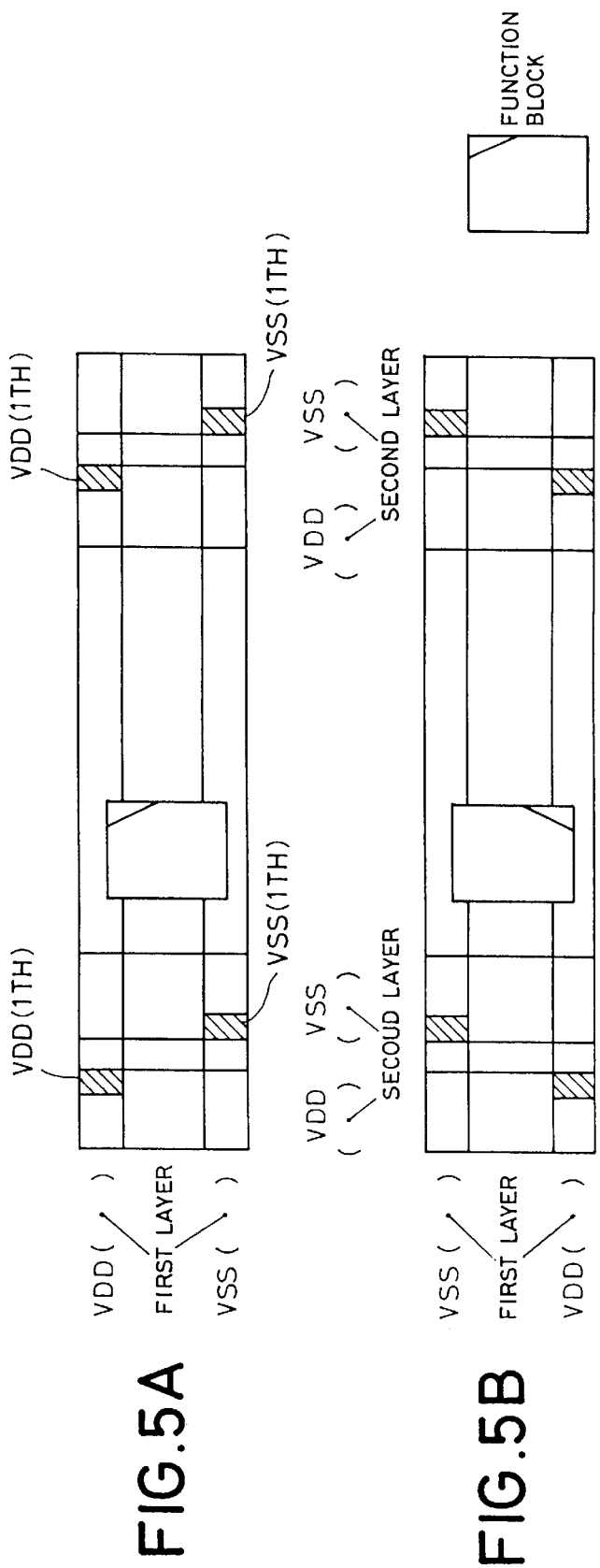
FIGS. 5A and 5B are illustration showing a basic pattern of a basic power source wiring grid in FIG. 4.

FIGS. 5A and 5B are illustrations showing the basic pattern of the basic power source wiring grid in FIG. 4. In FIGS. 5A and 5B, the basic power source wiring structure is consisted of the power source wiring and the grounding wiring in the first and second layers and the power source via and the grounding via (1TH). Width of the wiring and number of the power source via are set so that sufficient power may be supply for any function blocks arranged in maximum number.

On the other hand, the power source wiring and the grounding wiring, and the power source via and the grounding via (2TH) in the third layer supply power to all of the function blocks. Therefore, the power source wiring and the grounding wiring, and the power source via and the grounding via (2TH) in the third layer are not includes in the region for eliminating the power source in the shown embodiment according to the present invention.

It should be noted that FIG. 5A shows an example of arrangement of the power source via (VDD(1TH)] and the grounding via [VSS (1TH)] when the function block is connected to the power source wiring [VDD(first layer)] and the grounding wiring [VSS(first layer)] in a sequential order from the above. On the other hand, FIG. 5B shows an example of arrangement of the power source via (VDD (1TH)] and the grounding via [VSS(1TH)] when the function block is connected to the grounding wiring [VSS(first layer)] and the power source wiring [VDD(first layer)] in a sequential order from the above.

Figure 6:
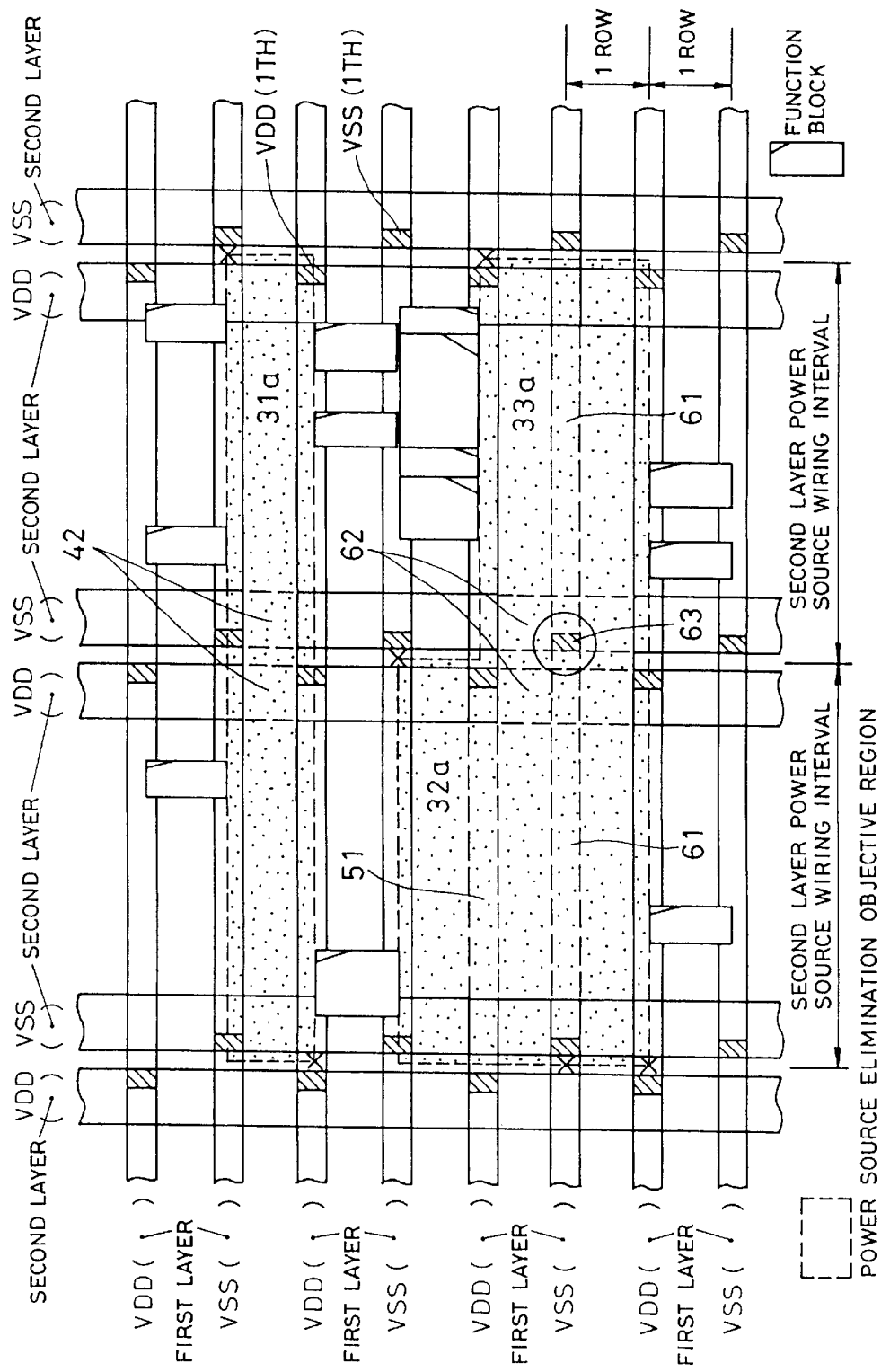
FIG. 6 is an illustration showing a condition of the power source wiring after arranging the function block in FIG. 4.

FIG. 6 is an illustration showing a condition of the power source wiring after arranging the function block in FIG. 4. In FIG. 6, there is shown a condition of the power source wiring in the first and second layers after arranging the function block on the basic pattern shown in FIG. 4. On the other hand, in FIG. 7, there is shown a condition after elimination of the power source from the pattern shown in FIG. 6.

Figure 7:
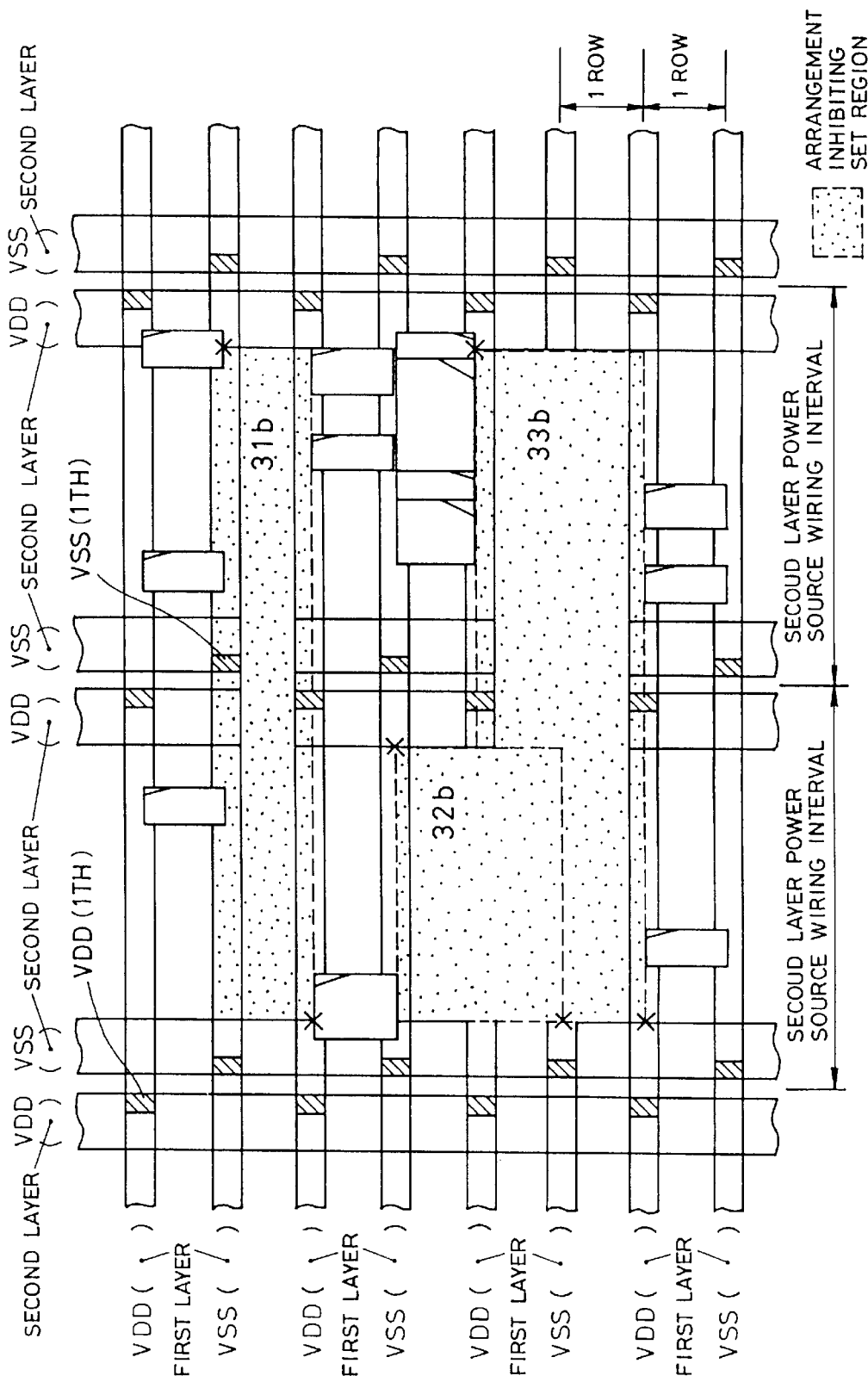
FIG. 7 is an illustration showing a condition of the power source wiring after elimination of wiring in FIG. 4.
Figure 8:
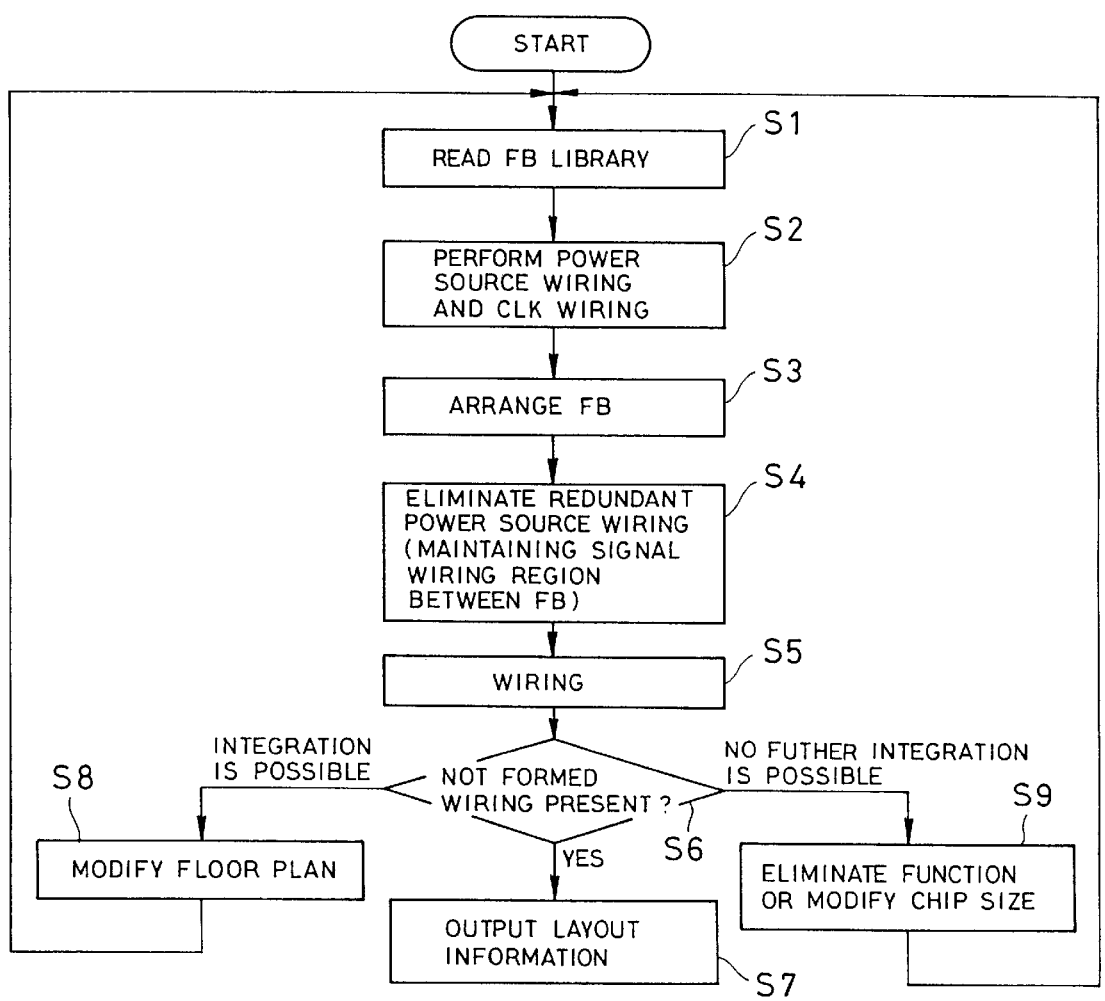
FIG. 8 is a flowchart showing a design process by the LSI layout designing system shown in FIG. 1.
Figure 9:
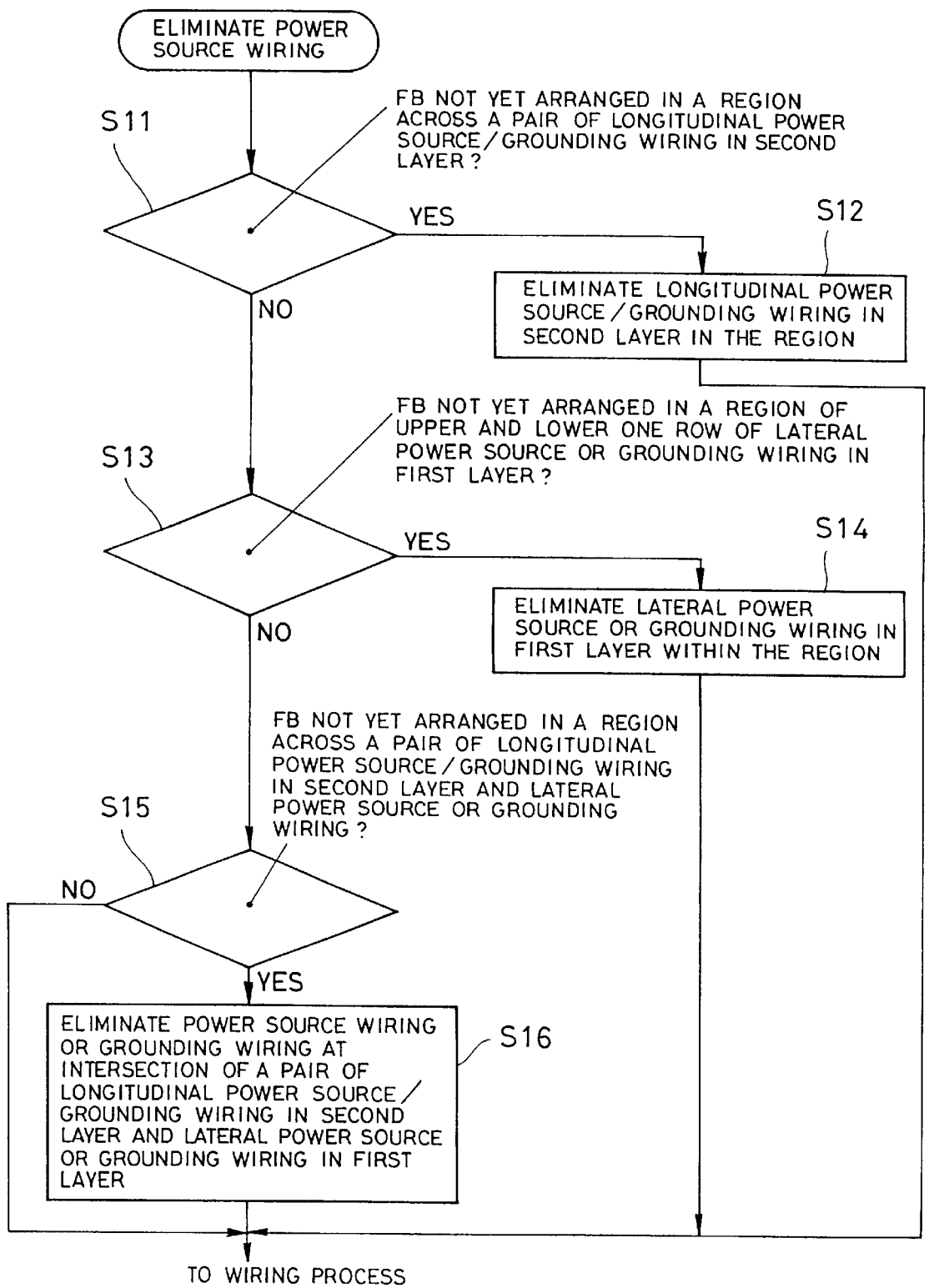
FIG. 9 is a flowchart showing a power source wiring eliminating process among the design process shown in FIG. 8.
Figure 10:
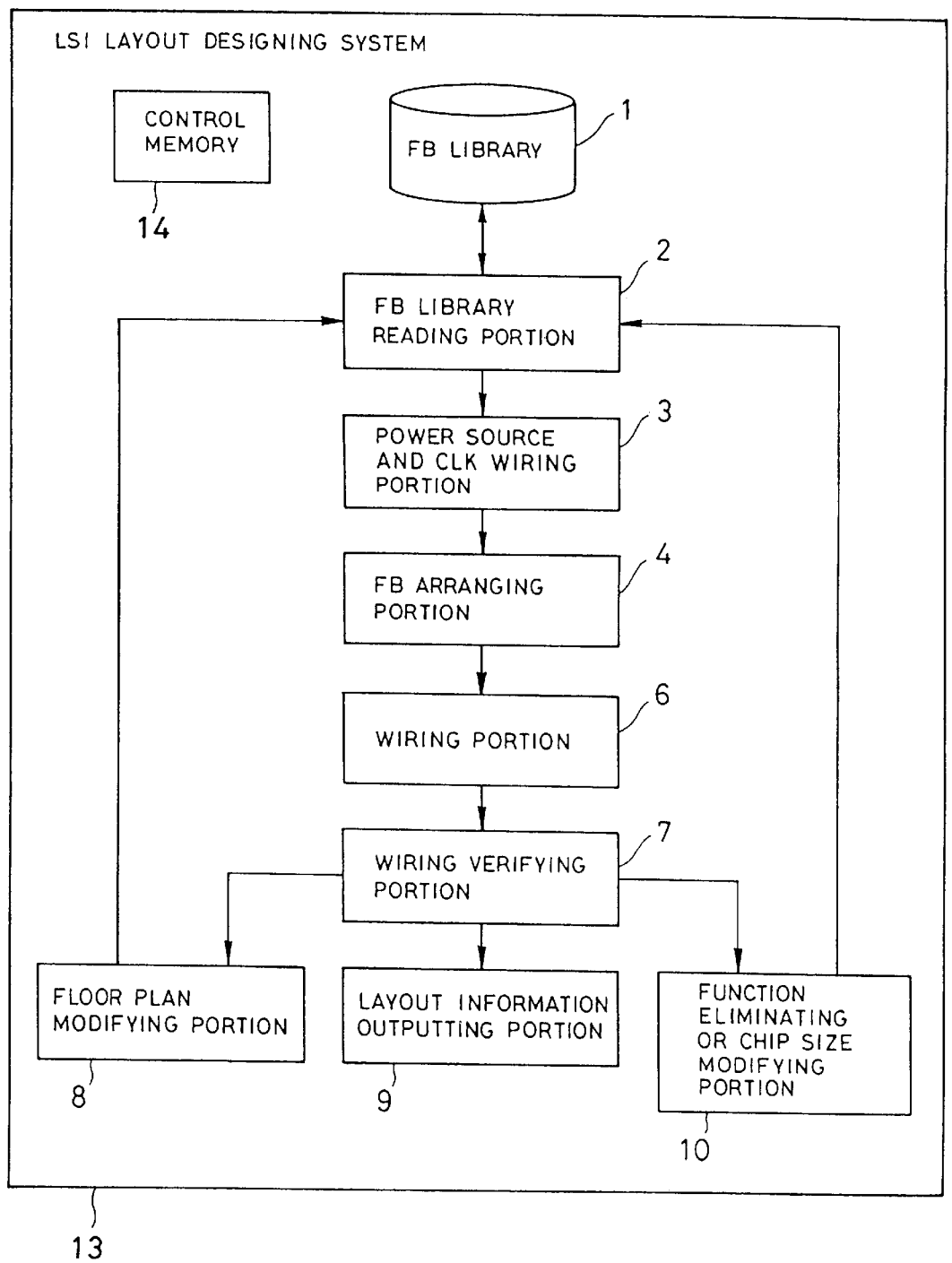
FIG. 10 is a block diagram showing a construction of the conventional LSI layout designing system.
Figure 11:
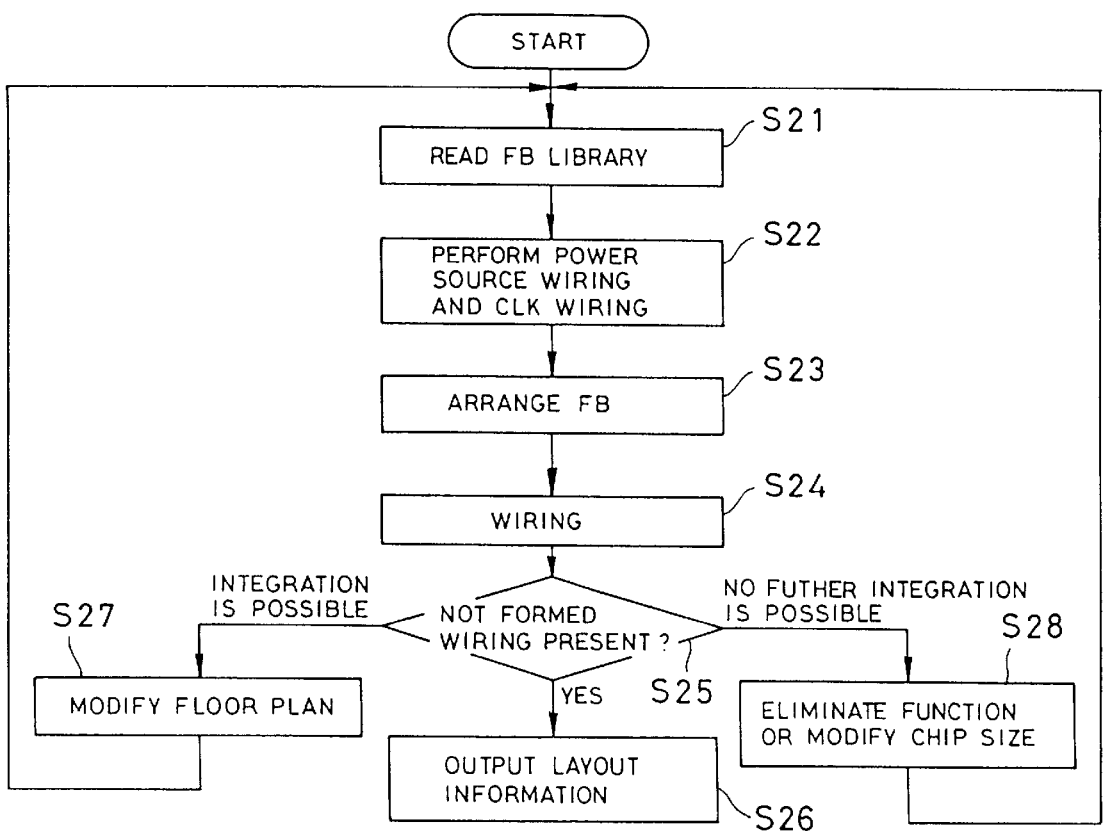
FIG. 11 is a flowchart showing the design process by the conventional LSI layout designing system shown in FIG. 10.

FIG. 8 is a flowchart showing design process to be implemented by the LSI layout designing system shown in FIG. 1, and FIG. 9 is a flowchart showing a power source wiring eliminating process in the design process shown in FIG. 8. Design process according to one embodiment of the present invention will be discussed hereinafter with reference to FIGS. 1 to 9. It should be noted that the process operation shown in FIGS. 8 and 9 can be realized by executing the programs stored in the control memory 12 by respective of corresponding portions of the LSI layout designing system.

When the function block library reading portion 2 reads out information necessary for layout design from the function block library 1 (step S1 of FIG. 8), the power source and clock wiring portion 3 performs power source wiring operation and clock wiring operation on the basis of the read out information. (step S2 of FIG. 8). After the power source wiring operation and the clock wiring operation, the function block arranging portion 4 arranges the function blocks (step S3 of FIG. 8) [see FIG. 3A and FIG. 6].

The redundant power source wiring eliminating portion 5 is active after arranging the function block, to eliminate the redundant power source wiring (step 4 of FIG. 8). The wiring portion 6 performs wiring operation for the arranged function blocks (step S5 of FIG. 8).

After completion of wiring operation by the wiring portion 6, the wiring verifying portion 7 checks whether not yet formed wiring is present or not (step S6 of FIG. 8). The wiring verifying portion 7 makes judgment whether not yet formed wiring is present and integration is possible. If the result of judgment is positive, the floor plan modifying portion 8 modifies a floor plan and returns control to the function block library reading portion 2 (step S8 of FIG. 8).

If the result of checking in the wiring verifying portion 7 shows that the not yet formed wiring is not present, the lay out information outputting portion 9 outputs the layout information generated through the foregoing process (step S7 of FIG. 8). On the other hand, if the result of judgment in the floor plan modifying portion 8 shows that not yet formed wiring is present but no further integration is possible, the function eliminating or chip size modifying portion 10 eliminates the function or modifies a chip size and then returns control to the function block library reading portion 2 (step S9 of FIG. 8).

In the foregoing power source wiring eliminating process (step S4 of FIG. 8), an objective region for power source elimination is a region other than the basic power source wiring grid of FIG. 5 where the function block is arranged. In the power source wiring and the grounding wiring and the power source via and the grounding via (1TH) in the first and second layers within the power source elimination objective region are eliminated. It should be appreciated that the power source eliminating method by the redundant power source wiring eliminating portion 5 may be the following three ways.

The redundant power source wiring eliminating portion 5 eliminates the longitudinal power source/grounding wiring 42 in the second layer within a region 31a (step S12) of FIG. 9) when the function block is not arranged within the region 31a across a pair of power source/grounding wiring 42 in the second layer (step S11 of FIG. 9).

The redundant power source wiring eliminating portion 5 eliminates the lateral power source wiring or the lateral grounding wiring 51 in the first layer in a region 32a (step S14 of FIG. 9) when the function block is not arranged in the region 32a of upper or lower one row of the lateral power source wiring or the lateral grounding wiring 51 in the first layer (step S13 of FIG. 9).

The redundant power source wiring eliminating portion 5 eliminates a pair of the longitudinal power source/grounding wiring 62 in the second layer in a region 33a, the lateral power source or grounding wiring 61 in the first layer in the region 33a, and the power source via or the grounding via (1TH) 63 where a pair of the longitudinal power source/grounding wiring 62 in the second layer in the region 33a, the lateral power source or grounding wiring 61 in the first layer intersect (step S16 of FIG. 9) when the function block is not arranged in the region 33a across a pair of the longitudinal power source/grounding wiring 62 in the second layer and the lateral power source or grounding wiring 61 in the first layer (step S15 of FIG. 9) [see FIG. 3A and FIG. 6].

The region to be eliminated the power source wiring from the power source wiring pattern after arrangement of the function block as shown in FIG. 6, are set as arrangement inhibited regions 31b, 32b and 33b so as not to be arranged or re-arranged other function block [see FIG. 3B and FIG. 7].

For layout design of a gate array having the basic power source wiring structure, it is similarly possible to achieve higher wiring receiving ability and speeding up by eliminating the power source wiring and the power source via on the transistor, which are not used, by making the layout design tool to recognize the power source wiring structure.

In addition to the foregoing process, in the layout design of the LSI, by eliminating the power source wiring and the power source via other than the basic power source wiring structure in the region where the function block is arranged, the region where the power source is eliminated can be used as the channel wiring region with certainly maintaining sufficient power supply for the function block. Therefore, high wiring receiving ability can be achieved.

As set forth above, in the layout design of LSI having the basic power source wiring structure consisted of the power source wiring and the grounding wiring, after arranging the function block by making the layout design tool to recognize the power source wiring structure, the basic power source wiring grid for supplying sufficient power to the function block is formed and remaining power source wiring and the power source via are eliminated to facilitate to obtain enough space for arranging the channel region for the signal in the region where the power source is eliminated.

On the other hand, associating with elimination of the power source wiring, ratio of by-pass wiring can be reduced to enable shortening the signal wiring delay period to contribute for speeding up of the LSI. Furthermore, by prevention or reducing occurrence or modification of the floor plan, modification of logic, elimination of logical function for receiving the not yet formed wiring, process set in designing can be significantly reduced and lowering of performance can be prevented.

As set forth above, according to the present invention, in the integrated circuit layout designing system performing layout design of the integrated circuit having the basic power source wiring structure consisted of the power source wiring and the grounding wiring, high wiring receiving ability, speeding up of the LSI by shortening of delay period in the signal wiring, significant reduction of the process step in designing, and prevention of lowering of performance can be achieved by eliminating the power source wiring and the power source via other than the basic power source wiring structure for supplying power for the function block after arranging the function block on the basic power source wiring structure.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. An integrated circuit layout designing system for performing a layout design of an integrated circuit having a basic power source wiring structure having a power source wiring and a grounding wiring, comprising:

arrangement means for arranging a function block on said basic power source wiring structure, and eliminating means for eliminating portions of said power source wiring and a power source via other than said basic power source wiring structure which supplies power to said function block after arranging said function block on said basic power source wiring structure.

2. An integrated circuit layout designing system as set forth in claim 1, wherein said eliminating means frees up space on said integrated circuit to assure obtaining a signal wiring channel region.

3. An integrated circuit layout designing system as set forth in claim 1, further including means for inhibiting arranging of another function block in a region where said power source wiring and said power source via are eliminated.

4. A power source eliminating method in a layout design of an integrated circuit having a basic power source wiring structure having a power source wiring and a grounding wiring, comprising a step of:

arranging at least one function block on said basic power source wiring structure, and eliminating portions of said power source wiring and a power source via other than said basic power source wiring structure which supplies power to said function block after arranging said function block on said basic power source wiring structure.

5. A power source eliminating method as set forth in claim 4, wherein said step of eliminating said power source wiring and said power source via frees up space on said integrated circuit and thus assures obtaining a signal wiring channel region.

6. A power source eliminating method as set forth in claim 4, further including the step of inhibiting arranging of another function block in a region where said power source wiring and said power source via are eliminated.

7. A storage medium recording a power source elimination control program to be executed by a computer for eliminating a power source wiring in a layout design of an integrated circuit having a basic power source wiring structure which includes a power source wiring and a grounding wiring, said power source elimination control program executing on said computer to cause said computer to perform the step of:

arranging at least one function block on said basic power source wiring structure; and eliminating portions of said power source wiring and a power source via other than said basic power source wiring structure which supplies power to said function block after arranging said function block on said basic power source wiring structure.

8. A storage medium as set forth in claim 7, wherein said power source elimination control program is executed upon eliminating said power source wiring and said power source via, for freeing up space on said integrated circuit for a signal wiring channel region.

9. A storage medium as set forth in claim 7, wherein said power source elimination control program inhibits arranging of another function block in a region where said power source wiring and said power source via are eliminated.

10. An integrated circuit layout designing system for performing layout design of an integrated circuit having a basic power source wiring structure defined by a power source wiring and a grounding wiring in first to third layers, arranged into a regular grid and having at least one power source via and a grounding via establishing electrical connection between first and second layers, and having another power source via and said grounding via for establishing electrical connection between second and third layers, comprising arrangement means for arranging a function block on said basic power source wiring structure; and eliminating means for eliminating portions of said power source wiring and a power source via in said first and second layers other than said basic power source wiring structure which supplies power to said function block after arranging said function block on said basic power source wiring structure.

11. An integrated circuit layout designing system as set forth in claim 10, wherein said eliminating means frees up space on said integrated circuit to assure obtaining a signal wiring channel region.

12. An integrated circuit layout designing system as set forth in claim 10, wherein said eliminating means eliminates said power source wiring and said grounding wiring in said second, layer within a region when said function block is not arranged across a pair of said power source wiring and said grounding wiring in said second layer.

13. An integrated circuit layout designing system as set forth in claim 10, wherein said eliminating means eliminates one of said power source wiring and said grounding wiring in said first layer within a region when said function block is not arranged in between one of upper and lower rows of said power source wiring and said grounding wiring of said first layer.

14. An integrated circuit layout designing system as set forth in claim 10, wherein said eliminating means eliminates a pair of said power source wiring and said grounding wiring in said second layer within a region defined by one of a pair of power source wiring and said grounding wiring in said second layer and a pair of said power source and grounding wiring in said first layer, and eliminates one of said power source via and said grounding via where one of a pair of said power source wiring and said grounding wiring in said second layer within a region defined by one of a pair of power source wiring and said grounding wiring in said second layer and a pair of said power source and grounding wiring in said first layer are intersects, when said function block is not arranged in a region defined by one of a pair of said power source wiring and said grounding wiring in said second layer and a pair of said power source wiring and said grounding wiring in said first layer.

15. An integrated circuit layout designing system as set forth in claim 10, further including means for inhibiting arranging of another function block in a region where said power source wiring and said power source via are eliminated.

16. A power source eliminating method for an integrated circuit layout designing for performing layout design of an integrated circuit having a basic power source wiring structure defined by a power source wiring and a grounding wiring in first to third layers, arranged into a regular grid and having at least one power source via and a grounding via establishing electrical connection between first and second layers, and having another power source via and said grounding via for establishing electrical connection between second and third layers, comprising the steps of:

arranging a function block on said basic power source wiring structure; and eliminating said power source wiring and a power source via in said first and second layers other than said basic power source wiring structure for supplying a power to a function block after arranging said function block on said basic power source wiring structure.

17. A power source eliminating method as set forth in claim 16, wherein said eliminating step frees up slpace on said integrated circuit and thusassures obtaining a signal wiring channel region.

18. A power source eliminating method as set forth in claim 16, wherein said eliminating step eliminates said power source wiring and said grounding wiring in said second layer within a region when said function block is not arranged across a pair of said power source wiring and said grounding wiring in said second layer.

19. A power source eliminating method as set forth in claim 16, wherein said eliminating step eliminates one of said power source wiring and said grounding wiring in said first layer within a region when said function block is not arranged between one of upper and lower rows of said power source wiring and said grounding wiring of said first layer.

20. A power source eliminating method as set forth in claim 16, wherein said eliminating step eliminates a pair of said power source wiring and said grounding wiring in said second layer within a region defined by one of a pair of power source wiring and said grounding wiring in said second layer and a pair of said power source and grounding wiring in said first layer, and eliminates one of said power source via and said grounding via where one of a pair of said power source wiring and said grounding wiring in said second layer within a region defined by one of a pair of power source wiring and said grounding wiring in said second layer and a pair of said power source and grounding wiring in said first layer intersects, when said function block is not arranged in a region defined by one of a pair of said power source wiring and said grounding wiring in said second layer and a pair of said power source wiring and said grounding wiring in said first layer.

21. A power source eliminating method as set forth in claim 16, further including the step of inhibiting arranging of another function block in a region where said power source wiring and said power source via are eliminated.

22. A storage medium storing a power source elimination control program to be executed by a computer for eliminating a power source wiring in an integrated circuit lay out having a basic power source wiring structure defined by a power source wiring and a grounding wiring in first to third layers, arranged into a regular grid and having at least one power source via and a grounding via establishing electrical connection between first and second layers, and having another power source via and said grounding via for establishing electrical connection between second and third layers, said power source elimination control program executing on said computer to cause said computer to perform the steps of:

arranging at least one function block in said basic power source wiring structure; and eliminating said power source wiring and a power source via in said first and second layers other than said basic power source wiring structure for supplying a power to a function block after arranging said function block on said basic power source wiring structure.

23. A storage medium as set forth in claim 22, wherein said power source elimination control program is executed by said computer so that said eliminating means frees up space on said integrated circuit and thus assures obtaining a signal wiring channel region.

24. A storage medium as set forth in claim 23, wherein said power source elimination control program is executed by said computer so that said eliminating means eliminates said power source wiring and said grounding wiring in said second layer within a region when said function block is not arranged across a pair of said power source wiring and said grounding wiring in said second layer.

25. A storage medium as set forth in claim 22, wherein said power source elimination control program is executed by said computer so that said eliminating means eliminates one of said power source wiring and said grounding wiring in said first layer within a region when said function block is not arranged between one of upper and lower rows of said power source wiring and said grounding wiring of said first layer.

26. A storage medium as set forth in claim 22, wherein said power source elimination control program is executed by said computer so that said eliminating means eliminates a pair of said power source wiring and said grounding wiring in said second layer within a region defined by one of a pair of power source wiring and said grounding wiring in said second layer and a pair of said power source and grounding wiring in said first layer, and eliminates one of said power source via and said grounding via where one of a pair of said power source wiring and said grounding wiring in said second layer within a region defined by one of a pair of power source wiring and said grounding wiring in said second layer and a pair of said power source and grounding wiring in said first layer are intersects, when said function block is not arranged in a region defined by one of a pair of said power source wiring and said grounding wiring in said second layer and a pair of said power source wiring and said grounding wiring in said first layer.

27. A storage medium as set forth in claim 22, wherein said power source elimination control program is executed by said computer so as to inhibit arranging of another function block in a region where said power source wiring and said power source via are eliminated.

* * * * *